(12) United States Patent
Li (10) Patent No.: US 6,593,774 B2
(45) Date of Patent: Jul. 15, 2003

(54) CMOS-INTERFACEABLE ECL INTEGRATED CIRCUIT WITH TRI-STATE AND ADJUSTABLE AMPLITUDE OUTPUTS

(75) Inventor: Qi Li, Fremont, CA (US)

(73) Assignee: Highpoint Technologies, Inc., Fremont, CA (US)

( * ) Notice: Subject to any disclaimer, the term of this patent is extended or adjusted under 35 U.S.C. 154(b) by 0 days.

(21) Appl. No.: 10/013,284

(22) Filed: Dec. 7, 2001

(65) Prior Publication Data

US 2003/0112034 A1 Jun. 19, 2003

(51) Int. Cl.[7] .............................................. H03K 19/018
(52) U.S. Cl. .............................. 326/75; 326/66; 326/67; 326/73; 326/77; 326/78
(58) Field of Search ...................................... 326/63–78

(56) References Cited

U.S. PATENT DOCUMENTS 5,352,941 A * 10/1994 Matsumoto et al. ........ 307/475
5,754,059 A * 5/1998 Tanghe et al. ................ 326/77
6,114,874 A * 9/2000 Bales ........................... 326/66

* cited by examiner

Primary Examiner—Michael Tokar
Assistant Examiner—Anh Q Tran
(74) Attorney, Agent, or Firm—Chi Ping Chang; Pacific Law Group LLP (57) ABSTRACT

An improved ECL circuit, based upon an ECL circuit of conventional design, functions as the required transceiver for the bi-directional data transmission between a computer and an electronic device with a specific interface of USB 2.0. The value of an emitter resistor within an emitter resistance network in the conventional ECL circuit is adjusted till its output voltage amplitude meets the USB 2.0 specification. A number of voltage level shifting and capacitive coupling circuits are added to both the input and output sections of the conventional ECL circuit making it directly interfaceable with the popular CMOS logic family. A collector electrode switch network is also added to the conventional ECL circuit to make its output terminals tri-statable thus compatible with the communication scheme of half duplexing under the USB 2.0 specification.

6 Claims, 7 Drawing Sheets

Fig. 4 : Typical ECL Circuit (Prior Art)

Fig. 5 : Improved ECL Circuit

Fig. 6 : Capacitor Coupling Circuit

Fig. 7A : Voltage Shifting Circuit One

Fig. 7B : Voltage Shifting Circuit Two

CMOS-INTERFACEABLE ECL INTEGRATED CIRCUIT WITH TRI-STATE AND ADJUSTABLE AMPLITUDE OUTPUTS

FIELD OF THE INVENTION

This invention is related to a technique and associated integrated circuitry for data signal transmission within a computer or between any electronic devices. In particular, the related application is for, although not limited to, the high speed serial data communication through a Universal Serial Bus (USB) with the industry standard specification of USB 2.0. A related technique of data communication is half duplexing. Some related technologies for logic circuitry are Emitter Coupled Logic (ECL) and Complementary Metal-Oxide-Semiconductor transistor (CMOS).

BACKGROUND OF THE INVENTION

With the rapid development of information technology, the peripherals of a computer are no longer limited to the following list of traditional elements:

keyboard, mouse, hard disk, optical disk and printer.

In fact, the list of computer peripherals now includes additional elements such as digital camera, digital video camera, digital color scanner, digital audio recording system and so on. As a consequence, the computer is not only used to process classical text information such as in a word processing or a spread sheet application, the computer also needs to process the vast amount of information contained in figures, images and audio titles, etc. In order to deal with such vast amount of information, the computer not only needs a powerful Central Processing Unit (CPU), but also, sometimes even critical, needs a much higher data transmission rate with its peripherals. For example, a high data transmission rate is simply needed between a computer and a high quality digital video camera. For another example, a high data transmission rate is especially important within a computer network system to prevent data congestion.

Figure 1A:
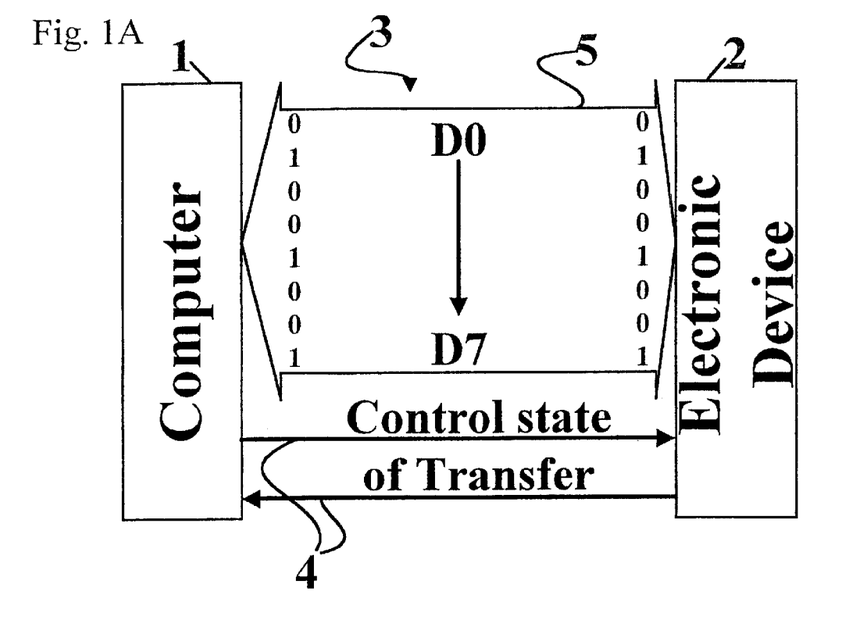
FIGS. 1A–B illustrate examples of a parallel interface and a serial interface between a computer and an electronic device.

The hardware conduit of signal transmission between a computer and various electronic devices is called a bus. Physically, a bus consists of a set of ordered signal wires with each of the signal wires having a precise signal definition. Generally the bus can be broadly classified, according to its construction, into two types: parallel interface and serial interface. An example of parallel interface 3 is illustrated in FIG. 1A for signal transmission between a Computer 1 and an electronic device 2. In addition to a number of control signals 4, the parallel interface 3 consists of a group of, in this example, eight (8) parallel data signals D0–D7 5 carrying bidirectional data signals between the Computer 1 and the electronic device 2. At a particular instant, a data pattern of (01001001) is carried by the parallel data signals D0–D7 5 as indicated. Under a given data clock rate, the parallel interface 3 can provide a much higher data transmission rate proportional to the number of parallel data signals (in this case 8). However, due to an inherent cross coupling of neighboring parallel data signals, the parallel interface 3 can only reach a shorter transmission distance before the development of excessive noise from the cross coupling effect. As the magnitude of noise from cross coupling is generally proportional to the data clock rate, it follows that, in general, the higher the data clock rate is, the shorter the maximum transmission distance is allowed.

Figure 1B:
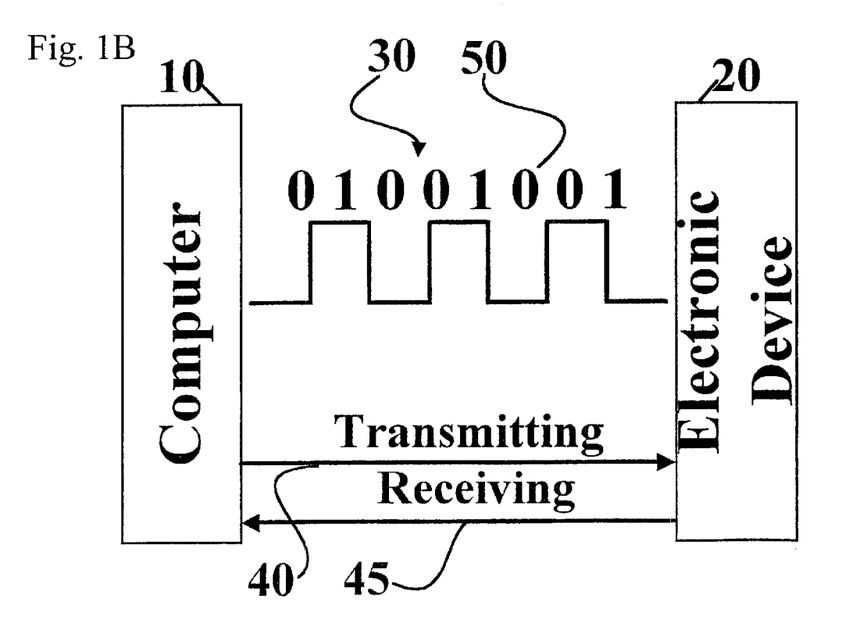

An example of serial interface 30 is illustrated in FIG. 1B for signal transmission between a computer 10 and an electronic device 20. The serial interface 30 consists of, in this example, only two signals: a serial transmitting signal 40 carrying a uni-directional data signal from the computer 10 to the electronic device 20 and a serial receiving signal 45 carrying a uni-directional data signal from the electronic device 20 to the computer 10. Being a serial interface, an example data pattern of (01001001) is carried by the serial transmitting signal 40 with an example transmitting data pattern 50 in the time domain as indicated. Technically, for a long time, the data transmission rate of the serial interface 30 had been limited to 115 Kb/s–230 Kb/s (Kilobits/second), which was only about one eighth of the typical data transmission rate of the parallel interface. However, since 1994 a series of USB (Universal Serial Bus) specifications, targeting a highly flexible serial interface at a data transmission rate much higher than the 115 Kb/s–230 Kb/s, have been published for implementation following discussion and collaboration amongst many established computer and communication manufacturers in the world. For example, one of the specifications is USB1.1 having a data transmission rate of 12 Mb/s(Megabits/second). While the technique of serial interfacing, having to perform such extra tasks as control of transmission timing, bidirectional data transformation between serial and parallel format, bit counting, is more complex than that of parallel interfacing and the serial data transmission rate is inherently lower, the associated benefits support the enthusiastic adoption of USB by the market. For example, with the adoption of differential low level signal technology, the data transmission rate of USB is much improved. As the serial interface has a smaller number of signal wires than the parallel interface, the serial interface is simpler and the cost of its transmission cable is lower. The USB specification also has other benefits like easiness of usage, easiness of connection, multimedia support and self-powering, etc. Additionally, the USB1.1 supports the connection of multiple devices through a single interface cable, the function of PnP (Plug and Play) and is built into the Windows operating system. Therefore, by now, USB1.1 has already been widely adopted in the microcomputer and computer networking industry. More recently, following the USB1.1, a USB2.0 specification was published in 1999 with an even higher data transmission rate of 480 Mb/s while maintaining its compatibility with the USB1.1. Thus, the USB2.0 is expected to further promote the development of peripheral devices for the microcomputer and many components for the data communication industry. As already stated, USB is a serial interface.

At the hardware level, to support such a high and ever growing data transmission rate of USB, the established technology of Emitter Coupled Logic (ECL) represents a natural choice for the base of implementation of the associated transceivers. For those skilled in the art, ECL is a family of high speed digital circuitry based upon bipolar transistors. When its switching transistor is in the state of conduction, the conductive transistor works in a state of non-saturation. Thus, when the conductive transistor is later switched off, there will be no memory effect causing an associated time delay. This means ECL can work at a higher frequency. The cause of this memory effect is the excess minority carriers in the base of the transistor requiring time for recombination with a corresponding number of majority carriers during the switching process. The associated circuit resistance value of ECL is generally low making it highly immune to external noises. The reason is that most noise sources have high output impedance thus only capable of producing a small voltage disturbance on a low resistance load. Thus, in combination with a small logic swing of their output voltage, ECL circuits have achieved, with a propagation delay time under 1 ns, the highest operating frequency of all digital circuits. As the output section of ECL uses an emitter follower structure of low output impedance, ECL is capable of high load driving capacity such as the load from a serial interface cable. With a balanced circuit topology, the transient change of power supply current of ECL is relatively small during a logic switching process that allows the resulting switching noise to be correspondingly small. Again with a balanced circuit topology, the logic output of ECL is complementary that makes it convenient and quick to use. Notwithstanding all the above superior characteristics, ECL does have some drawbacks. For example, its low circuit resistance means higher power consumption for a given supply voltage. As the transistors of ECL operate in a state of no-saturation, the stability of its output voltage level is lower and it is more sensitive to the change of environmental temperature. The small logic swing of ECL output voltage affords an allowable noise amplitude of only 200 mV RMS (Root Mean Square). Realizing these drawbacks of ECL, substantial efforts aimed for its improvement have already been underway. For example, currently the sub-nanosecond ECL integrated circuit employs the technique of compensation for the variation of temperature and supply voltage thus maintaining the normal functionality of the circuit regardless of these variations.

While ECL represents a natural base for the implementation of USB transceivers, a number of incompatibilities between the two still remain to be removed. First, the output voltage amplitude of ECL is fixed at 800 mV peak-peak that is too high compared to the USB specification. Secondly, most computers and peripheral electronic devices nowadays employ CMOS (Complementary Metal Oxide Semiconductor) logic circuits which is not directly interfaceable with ECL. Thirdly, the USB calls for a scheme of communication called half duplexing, which is also not directly compatible with the ECL circuitry. Therefore, with the continuing market advancement of the USB, there is a strong need of improving the ECL technology so that it can be adapted to conform to the USB specification thereby functions as effective USB transceivers.

SUMMARY OF THE INVENTION

An object of the present invention is to adapt the ECL technology so that it conforms to the USB specification thereby functions as effective USB transceivers.

More specifically, in the present invention, an emitter resistance network is modified in the ECL circuit to adjust its output voltage amplitude till it meets the USB specification. A number of signal level shifting circuits are added at both the input and output sections of the ECL circuit to make it directly interfaceable with CMOS logic. A collector electrode switch network is also added to the ECL circuit to make it compatible with the communication scheme of half duplexing for the USB.

Other objectives, together with the foregoing are attained in the exercise of the invention in the following description and resulting in the embodiment illustrated in the accompanying drawings.

BRIEF DESCRIPTION OF DRAWINGS

The current invention will be better understood and the nature of the objectives set forth above will become apparent when consideration is given to the following detailed description of the preferred embodiments. For clarity of explanation, the detailed description further makes reference to the attached drawings herein.

DETAILED DESCRIPTION OF PREFERRED EMBODIMENTS

In the following detailed description of the present invention, numerous specific details are set forth in order to provide a thorough understanding of the present invention. However, it will become obvious to those skilled in the art that the present invention may be practiced without these specific details. In other instances, well known methods, procedures, components, and circuitry have not been described in detail to avoid unnecessary obscuring aspects of the present invention. The detailed description is presented largely in terms of logic blocks and other symbolic representations that directly or indirectly resemble the operations of signal processing devices coupled to networks. These descriptions and representations are the means used by those experienced or skilled in the art to most effectively convey the substance of their work to others skilled in the art.

Reference herein to "one embodiment" or an "embodiment" means that a particular feature, structure, or characteristics described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations of the invention.

Figure 2A:
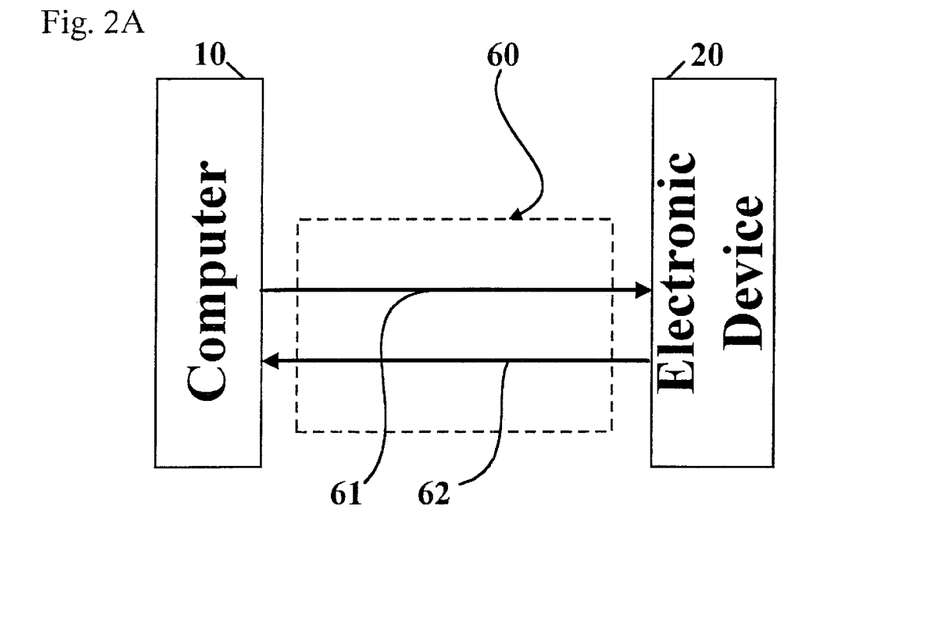
FIGS. 2A–B illustrates another serial bus hardware for differential signal transmission between a computer and an electronic device with the next level details of computer-side and device-side transceivers operating with a communication scheme of half duplexing such as specified in the USB.

FIG. 2A illustrates an example of a serial bus hardware 60 for signal transmission between a computer 10 and an electronic device 20. The serial bus hardware 60 consists of a transmitting signal wire 61 carrying time-sequential serial data from the computer 10 to the electronic device 20 and a receiving signal wire 62 carrying time-sequential serial data from the electronic device 20 to the computer 10.

Figure 2B:
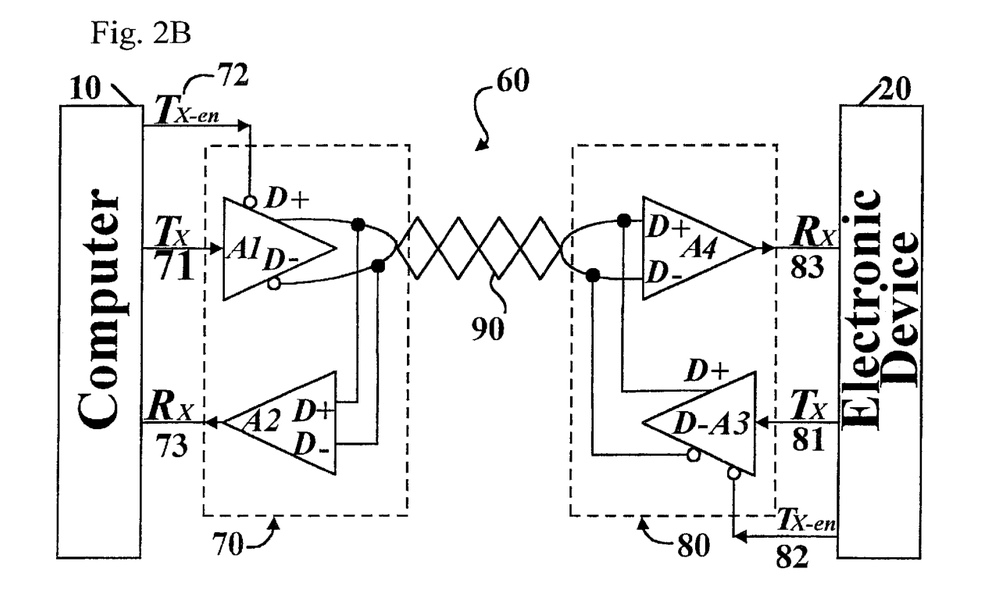

FIG. 2B illustrates another serial bus hardware for differential signal transmission between a computer and an electronic device with the next level details of computer-side and device-side transceivers operating with a communication scheme of half duplexing such as specified in the USB. Notice that, with differential signal transmission and a communication scheme of half duplexing between the computer 10 and the electronic device 20, the serial bus hardware 60 now consists of a twisted wire pair 90 carrying only one differential signal. Thus, at any time instant, the twisted wire pair 90 can only transmit data either from the computer 10 to the electronic device 20 or from the electronic device 20 to the computer 10, but not both. To satisfy the requirement of bi-directional data transmission between computer 10 and electronic device 20, a scheme of time-domain data multiplexing is implemented by a computer-side transceiver 70 and a device-side transceiver 80. The computer-side transceiver 70 consists of a transmitter A1 and a receiver A2. The transmitter A1 receives an input data signal Tx 71 from the computer 10 while gated by a signal Tx-en 72. The receiver A2 drives a signal Rx 73 into the computer 10. The transmitter A1 drives, through its output terminals D+ and D−, the twisted wire pair 90 going to the side of the electronic device 20. It is also important to note that, simultaneously, the transmitter A1 also drives the input of the receiver A2. Similarly, like a mirror image of the computer side, identical circuit topology is implemented amongst the components transmitter A3, receiver A4, signal Tx 81, signal Tx-en 82, signal Rx 83 and the output terminals D+ and D− of transmitter A3. Thus, for example, when the computer 10 is in the transmitting mode and the electronic device 20 is in the receiving mode the signal Tx-en 72 is high and the signal Tx-en 82 is low allowing the input data signal Tx 71 to be amplified through the transmitter A1 driving the side of the electronic device 20 while disabling the transmitter A3. Meanwhile, to prevent the transmitter A1 from driving into the output circuitry of the transmitter A3 to cause functional failure, the output terminals D+ and D− of the transmitter A3 must be switched into a state of high-impedance. This means the output of the transmitter A3 must be tri-statable. A similar analysis with the electronic device 20 in the transmitting mode and the computer 10 in the receiving mode will result in another requirement that the output of the transmitter A1 must also be tri-statable.

Figure 3:
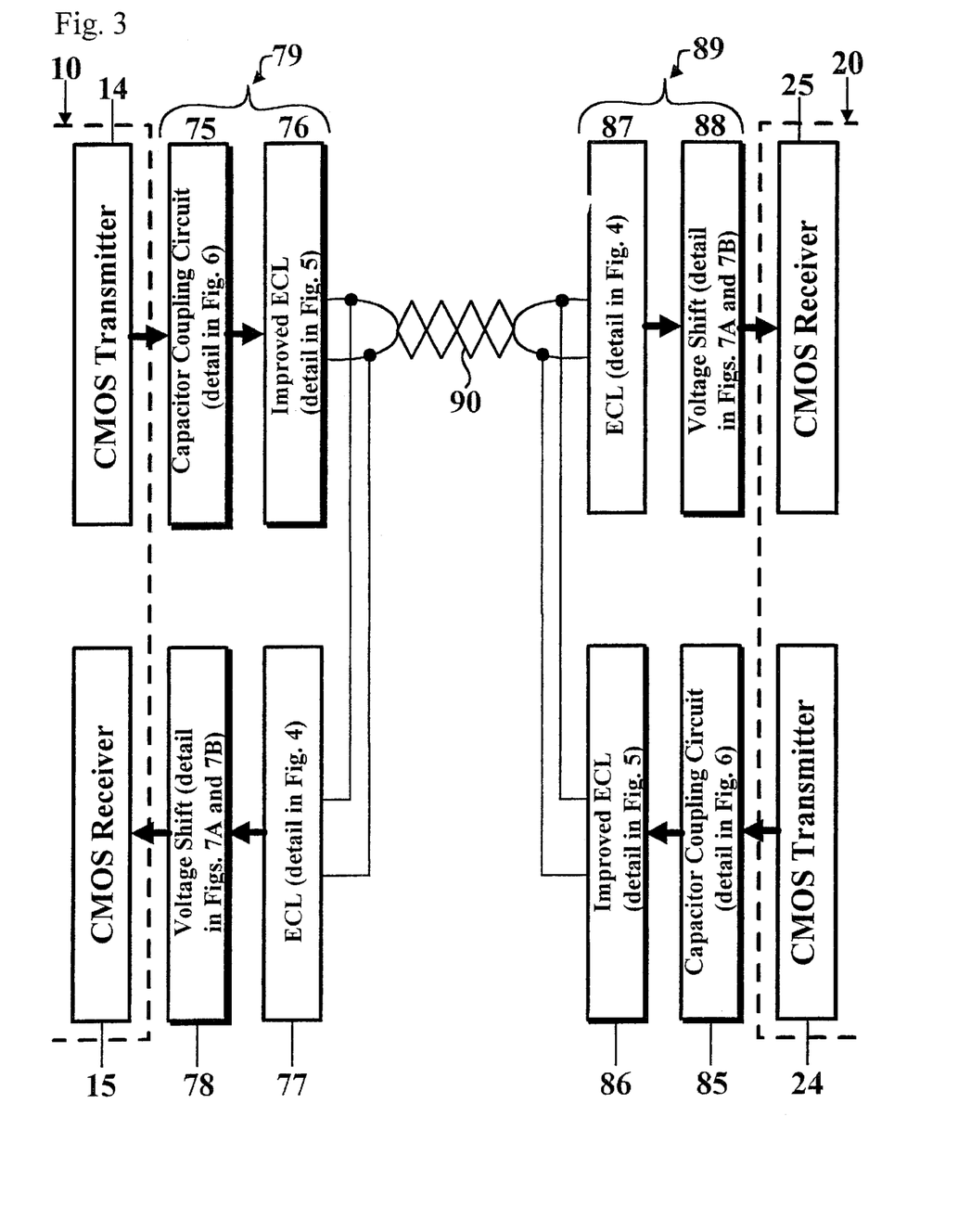
FIG. 3 is a systems overview of a preferred embodiment of the present invention for a USB transceiver operating in the half duplexing mode, with various subsystems of the present invention illustrated.

Following the description of systems hardware for differential signal transmission between a computer and an electronic under the USB specification as illustrated in FIG. 2B, FIG. 3 is a systems overview of a preferred embodiment of the present invention for a USB transceiver operating in the half duplexing mode, with various subsystems of the present invention illustrated in shaded blocks. The computer 10 comprises, for the purpose of interfacing with the electronic device 20 via the twisted wire pair 90, a CMOS transmitter 14 and a CMOS receiver 15. Likewise, the electronic device 20 comprises, for the purpose of interfacing with the computer 10 via the twisted wire pair 90, a CMOS transmitter 24 and a CMOS receiver 25. On the computer side, a USB transceiver 79 comprises a traditional ECL circuit 77, a voltage shifting circuit 78, a capacitor coupling circuit 75 and an improved ECL circuit 76. The traditional ECL circuit 77 is from the prior art and will be detailed in FIG. 4. Functionally, the traditional ECL circuit 77 acts as a simple ECL receiver taking the differential signals from the twisted wire pair 90 and converts them into proper single-ended signal to drive the voltage shifting circuit 78. The voltage shifting circuit 78 is from the present invention and will be described in FIG. 7A and FIG. 7B. Functionally, the voltage shifting circuit 78 takes the ECL output signals from the traditional ECL circuit 77 and converts them into CMOS input signals to drive the CMOS receiver 15 of the computer 10. The improved ECL circuit 76 is from the present invention and will be described in FIG. 5. Functionally, the improved ECL circuit 76 takes the ECL output signals from the capacitor coupling circuit 75, converts them to USB-conforming signal level and provides an appropriate driving capability to drive the twisted wire pair 90. Additionally, the improved ECL circuit 76 includes an output circuitry which is tri-statable as required by the aforementioned half duplexing mode of communication scheme specified by the USB. The capacitor coupling circuit 75 is also from the present invention and will be described in FIG. 6. Functionally, the capacitor coupling circuit 75 takes the CMOS output signals from the CMOS transmitter 14 of the computer 10 and converts them into ECL input signals to drive the improved ECL circuit 76. In a similar manner, on the device side, a USB transceiver 89 comprises a traditional ECL circuit 87, a voltage shifting circuit 88, a capacitor coupling circuit 85 and an improved ECL circuit 86 with their respective functions mirroring their corresponding circuits just described on the computer side. Therefore, the details of these component circuits of the USB transceiver 89 are the same as their corresponding circuits on the computer side thus will not be further described.

Figure 4:
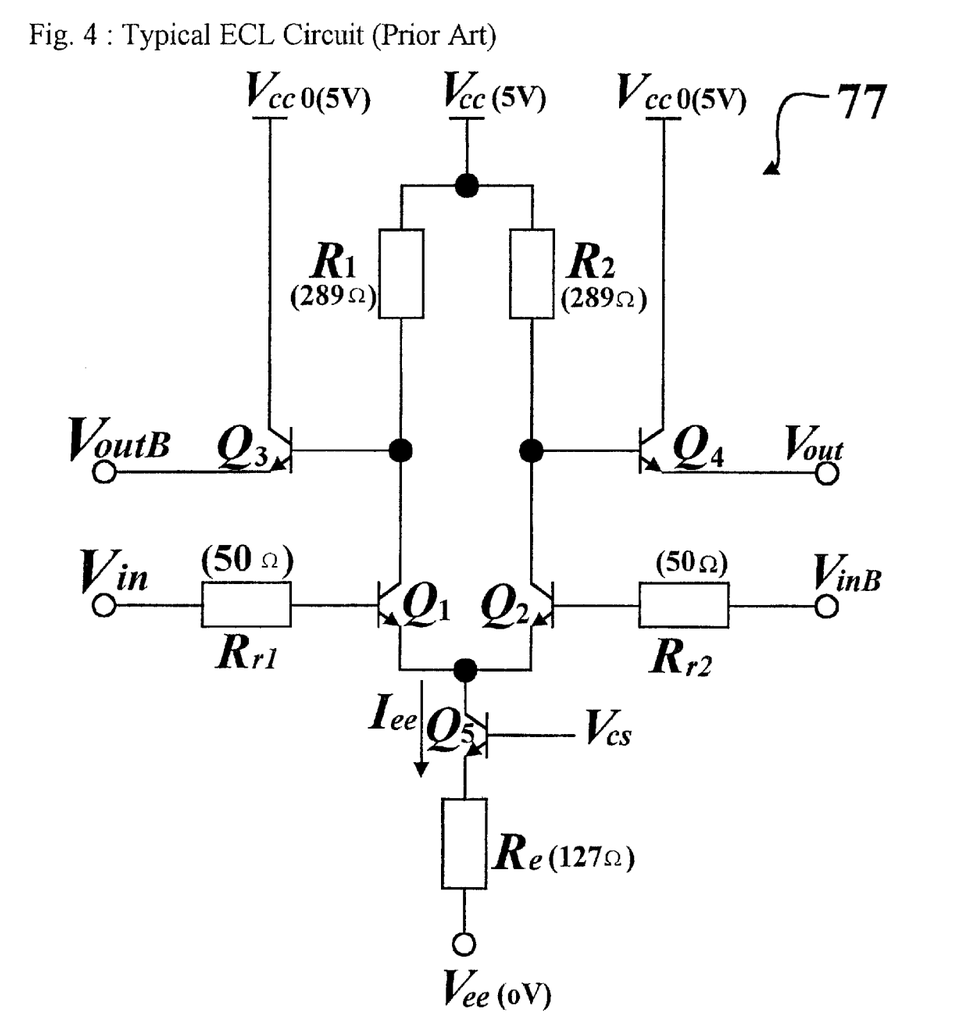
FIG. 4 illustrates a traditional ECL circuit from the prior art.

FIG. 4 illustrates details of the traditional ECL circuit 77 from the prior art. It can be found from an appropriate data book from MOTOROLA Ltd. Functionally, the traditional ECL circuit 77 is a differential receiver having differential input signals $V_{IN}$ and $V_{INB}$ switching, between the transistor pair $Q_1$ and $Q_2$, a constant current $I_{ee}$ that is set up by a transistor $Q_5$ and its emitter resistor $R_e$. The final pair of output voltages, $V_{out}$ and $V_{outB}$, respectively usable as a single-ended signal, are developed through load resistors $R_1$ and $R_2$ and buffered with emitter followers using transistors $Q_4$ and $Q_3$. Thus, the Boolean table of the traditional ECL circuit 77 is the following:

| Input | Output | |
|---|---|---|
| $V_{in}-V_{inB}$ | $V_{out}$ | $V_{outB}$ |
| 0 | 0 | 1 |
| 1 | 1 | 0 |

Figure 5:
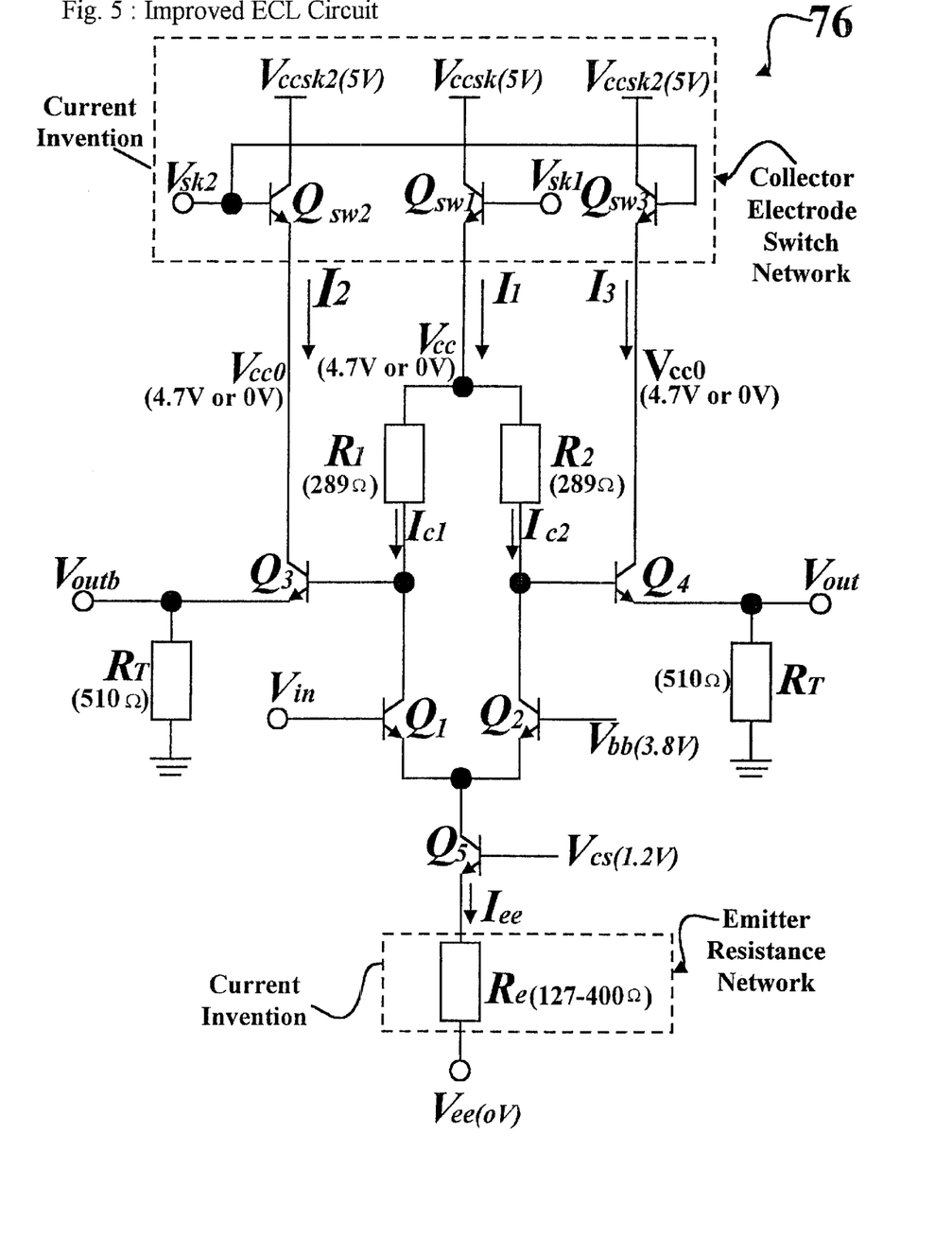
FIG. 5 details an improved ECL circuit according to a preferred embodiment of the present invention where an emitter resistance network is modified and a collector electrode switch network are added to the ECL circuit from the prior art.

FIG. 5 details the improved ECL circuit 76 according to a preferred embodiment of the present invention where an emitter resistance network is modified and a collector electrode switch network, respectively, enclosed in a dashed rectangle, are added to an ECL receiver from the prior art. The supply voltages and the value or range of the resistors for operation are also indicated. As remarked before, the output voltage amplitude of a traditional prior art ECL circuit is fixed at 800 mV peak-peak that is too high compared to the USB 2.0 specification of 400 mV peak-peak. Because the output voltage amplitude can be, among other parameters, controlled by the emitter resistor $R_e$, the value of the emitter resistor $R_e$ of the emitter resistance network can be modified to achieve the desired amplitude of output voltage. Quantitatively, we have:

$$I_{ee}=(V_{CS}-V_{BE(on)})/R_e,$$

where $V_{BE(on)}$ is the base-to-emitter forward voltage drop of transistor $Q_5$ when it is forward biased. As a symbolic convention, the following are defined:

$V_{IH}$=the logic-high voltage of a signal $V_{in}$,
$V_{IL}$=the logic-low voltage of a signal $V_{in}$,
$V_{OH}$=the logic-high voltage of a signal $V_{out}$, and
$V_{OL}$=the logic-low voltage of a signal $V_{out}$. Etc.

Thus, when $V_{in}=V_{IH}$ transistor $Q_1$ is switched into its forward-active state while transistor $Q_2$ is switched into its cut-off state. This means $I_{c1}=I_{ee}$, $I_{c2}=0$, $V_{out}=V_{OH}=V_{cc}-V_{BE(on)}$ and $V_{outb}=V_{OL}=V_{cc}-V_{BE(on)}-R_1 I_{ee}$, where $V_{BE(on)}$ is the base-to-emitter forward voltage drop of transistors Q3 and Q4. However, when $V_{in}=V_{IL}$ then $Q_1$ is switched into its cut-off state while transistor $Q_2$ is switched into its forward-active state. This means $I_{c1}=0$, $I_{c2}=I_{ee}$, $V_{out}=V_{OL}=V_{cc}-V_{BE(on)}-R_2 I_{ee}$ and $V_{outb}=V_{OH}=V_{cc}-V_{BE(on)}$. Therefore, the voltage swing of $V_{out}$ and $V_{outb}$ between their respective logic-high and logic-low levels is given by:

$$V_{swing}=V_{OH}-V_{OL}=R_2 I_{ee}=R_2(V_{CS}-V_{BE(on)})/R_e \quad (A)$$

where $V_{BE(on)}$ is the base-to-emitter forward voltage drop of transistor Q5, the same as that of transistors Q3 and Q4. Plugging in the following numerical values from FIG. 5 into formula (A):

$$R_1=R_2=289\Omega, V_{CS}=1.2V,$$

and let $V_{BE(on)}=0.7V$, a typical value for a transistor, $V_{sing}=0.4V$ (400 mV), the desired output voltage amplitude per USB 2.0 specification, the following value of the emitter resistor $R_e$ is solved:

$$R_e=R_2(V_{CS}-V_{BE(on)})/V_{swing}=289*(1.2-0.7)/0.4=361\Omega$$

This means that when $R_e=361\Omega$ then $V_{swing}=400$ mV, which meets the desired output voltage amplitude per USB 2.0 specification. Therefore, in this improved ECL circuit 76 of the present invention, by properly modifying the emitter resistor $R_e$ of the emitter resistance network a desired amplitude of output voltage can be achieved conforming to the USB 2.0 specification.

Next, another embodiment of a collector electrode switch network is shown to consist of three (3) switching transistors $Q_{SW1}$, $Q_{SW2}$ and $Q_{SW3}$ added to the power supply terminals, $V_{cc}$ and $V_{cc0}$ of the traditional ECL circuit. The collectors of transistors $Q_{SW1}$, $Q_{SW2}$ and $Q_{SW3}$ are respectively tied to power supplies $V_{ccsk}$, $V_{ccsk2}$ and $V_{ccsk2}$. Transistors $Q_{SW2}$ and $Q_{SW3}$ are controlled in parallel with a control signal $V_{sk2}$ while the transistor $Q_{SW1}$ is controlled by a control signal $V_{sk1}$. Thus, when the control signals $V_{sk1}$ and $V_{sk2}$ are switched above $V_{ccsk}=V_{ccsk2}=5V$ transistors $Q_{SW1}$, $Q_{SW2}$ and $Q_{SW3}$ enter the state of conduction with power supply currents $I_1$, $I_2$ and $I_3$ respectively flowing into nodes $V_{cc}$, $V_{cc0}$ and $V_{cc0}$ maintaining their high voltage levels of 4.7 V as indicated. This means that the traditional ECL circuit, located in the middle section of FIG. 5, will receive its normal power supply current and thus functions normally with its output signals ($V_{out}$, $V_{out\_b}$) driven into either one logic state (high, low) or the other (low, high) depending upon the logic level of the input signal $V_{in}$. However, when the control signals $V_{sk1}$ and $V_{sk2}$ are switched to ground (GND), or equivalently $V_{ee}$ of 0 Volt, transistors $Q_{SW1}$, $Q_{SW2}$ and $Q_{SW3}$ are cut-off, switching nodes $V_{cc}$, $V_{cc0}$ and $V_{cc0}$ into their low voltage levels of 0 V also as indicated, with the emitters of transistors $Q_3$, and $Q_4$ switched into the state of high impedance. This means that, with this embodiment of the added collector electrode switch network, the output signals ($V_{out}$, $V_{outb}$) of the modified ECL circuit are now switchable into their third state of high impedance as stated by the previously mentioned requirement of tri-statable output signals for serial data transmission under the scheme of half duplexing. For minimum product size, cost and power consumption, the improved ECL circuit 76 is implemented as an Application Specific Integrated Circuit (ASIC).

Figure 6:
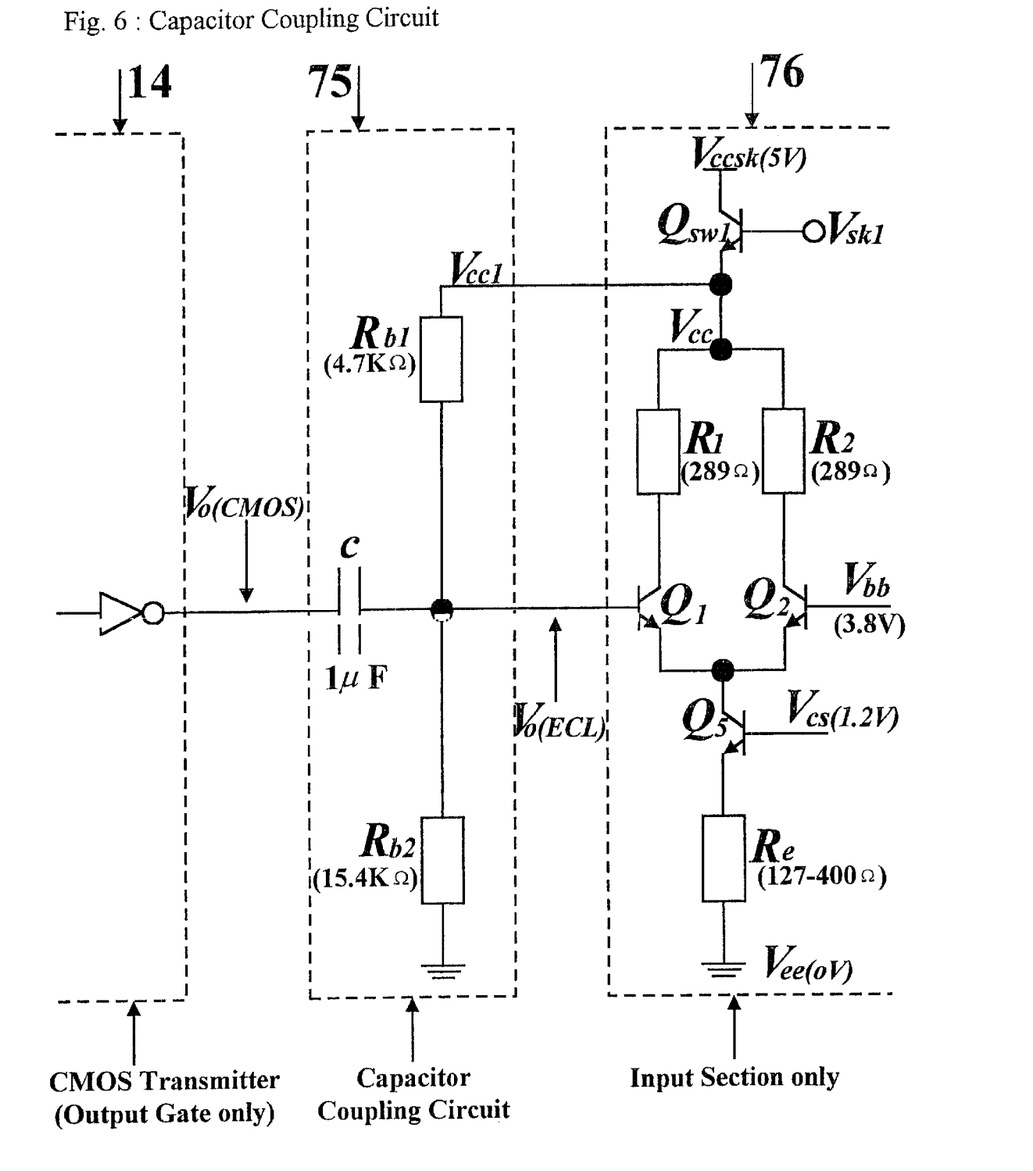
FIG. 6 details another preferred embodiment of the present invention where a capacitor coupling circuit is added to the input section of the improved ECL circuit so that it can be directly driven by a CMOS transmitter.

FIG. 6 details another preferred embodiment of the present invention where a capacitor coupling circuit 75 is added to the input section of the improved ECL circuit 76 so that it can be directly driven by a CMOS transmitter 14 having a CMOS output voltage $V_{o(CMOS)}$ that swings between a high of 3.3V and a low of GND. The capacitor coupling circuit 75 comprises a network of a serial pass capacitor C and two bias resistors $R_{b1}$ and $R_{b2}$ powered with a supply of 5V. In their quiescent logic state of HIGH, a CMOS output node, marked with $V_{o(CMOS)}$, consumes a negligible amount of current while an ECL input node, such as the base of transistor $Q_1$ marked with $V_{o(ECL)}$, draws a significant amount of current. With the capacitor coupling circuit 75, therefore, this difference in quiescent, or DC, current is isolated by the serial pass capacitor C while being supplied through the resistor network $R_{b1}$ and $R_{b2}$.

On the other hand, during any fast logic transition of the CMOS output voltage $V_{0(CMOS)}$ and with the circuit parameters of the capacitor coupling circuit 75 properly chosen, the fast logic transition of $V_{o(CMOS)}$ can be effectively coupled through to the node marked with $V_{o(ECL)}$. The reason is that the capacitor C is an energy-storage device whose voltage can not be instantaneously changed. While a slow enough logic transition of $V_{o(CMOS)}$ will still fail to be effectively coupled to the node $V_{o(ECL)}$, it is noted that the USB does specify a maximum allowable operating pulse width of 500 μs and this is the worst case under which the capacitor coupling circuit 75 must effectively couple through the logic transition of $V_{o(CMOS)}$ to the node $V_{o(ECL)}$. An example of design for this worst case is shown below where transistors $Q_{SW1}$, $Q_{SW2}$ and $Q_{SW3}$ are switched on thus $V_{cc1}=V_{cc}=4.7V$:

$$C=1 \mu F, R_{b1}=4.7 K\Omega \text{ and } R_{b2}=15.4 K\Omega.$$

The improved ECL circuit 76 has the following LOW, HIGH and THRESHOLD logic levels at its input node $V_{o(ECL)}$:

$$V_{IL(ECL)}=3.4V, V_{IH(ECL)}=4.2V \text{ and } V_{M(ECL)}=3.8V.$$

However, considering noise immunity that is required for a stable operation of the improved ECL circuit 76, in practice the THRESHOLD logic level of node $V_{o(ECL)}$ is set at a value of 3.6V that is slightly lower than $V_{M(ECL)}=3.8V$ and this is satisfied by the quiescent bias network consisting of $V_{cc1}$, $R_{b1}$ and $R_{b2}$:

$$V_{o(ECL)}=V_{cc1}*R_{b2}(R_{b1}+R_{b2}), \text{ or numerically,}$$

$$3.6 \text{ V}=4.7 \text{ V}*15.4 \text{ K}/(4.7 \text{ K}+15.4 \text{ K}).$$

With the supply voltage of the CMOS transmitter 14 equal to a typical value of 3.3V, we get the following LOW, HIGH and THRESHOLD logic levels at its output node $V_{o(CMOS)}$:

$$V_{OL(CMOS)}=0V, V_{OH(CHOS)}=3.3V \text{ and } V_{M(CHOS)}=1.4V.$$

Furthermore, the characteristic time constant of the capacitor coupling circuit 75 is given by:

$$\tau=C(R_{b1}\|R_{b2})=C*R_{b1}*R_{b2}/(R_{b1}+R_{b2}), \text{ or numerically in this example}$$

$$\tau=1*10^{-6}*4700*15400/(4700+15400)=3.6*10^{-3} \text{ sec}>>4.17 \text{ ns} (4.17*10^{-9} \text{ sec}).$$

As the 4.17 ns above corresponds to an operating frequency of 240 MHz, for those skilled in the art, the above relationship means a 240 MHz square wave, the maximum operating frequency for a 480 Mb/s data transmission rate per USB 2.0 specification, can be coupled through the capacitor coupling circuit 75 with negligible signal loss. Therefore, with the embodiment of the add-on capacitor coupling circuit 75 and one illustrative example set forth above, the improved ECL circuit 76 can now be directly driven by a CMOS transmitter 14 while satisfying the USB 2.0 requirements of 480 Mb/s data rate and a maximum allowable operating pulse width of 500 $\mu$S. For those skilled in the art, it should also be clear by now, as long as a circuit having its topology similar to that of the capacitor coupling circuit 75 is employed, multiple combinations of parameter values can be used for all its circuit components while achieving the same desired results.

Figure 7A:
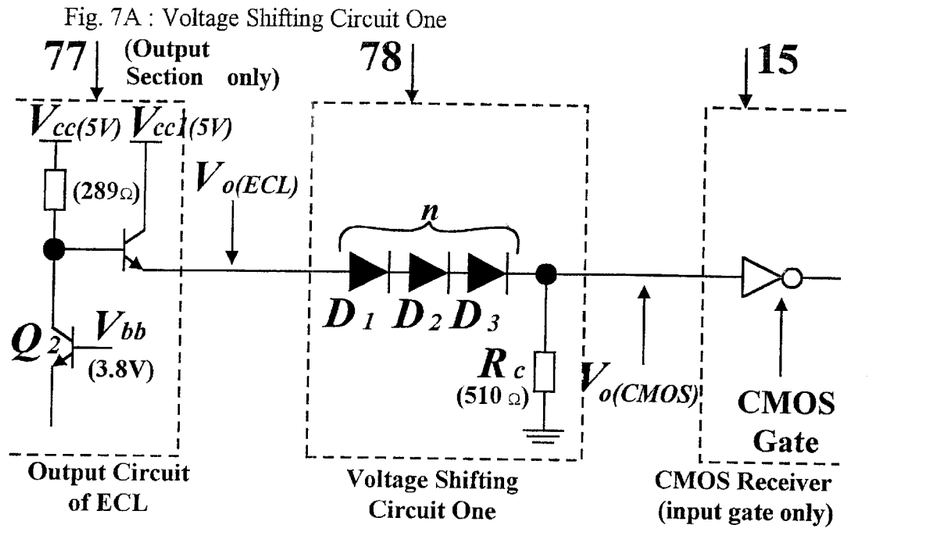
FIG. 7A details yet another preferred embodiment of the present invention where a first voltage shifting circuit is added to the output section of the ECL circuit from the prior art so that it can directly drive a CMOS receiver.

FIG. 7A details yet another preferred embodiment of the present invention where a first voltage shifting circuit 78 is added to the output section of the traditional ECL circuit 77 from the prior art so that it can directly drive a CMOS receiver 15. The voltage shifting circuit 78, enclosed in a dashed block, comprises a number, in this case three (3), of serially connected diodes D1, D2 and D3 and a resistor $R_c$ branched to GND. As the voltage drop across a forward biased diode stays relatively constant with the variation of its current, the forward biased diode can be used to effect the function of logic level shifting. In the traditional ECL circuit 77 with $V_{cc}$=5V, we get the following threshold logic level for the node $V_{o(ECL)}$:

$$V_{M(ECL)} \sim 3.8V$$

On the other hand, for the CMOS receiver 15 with a typical supply voltage of 3.3V, the following threshold logic level for the node $V_{o(CMOS)}$ is expected:

$$V_{M(CMOS)} \sim 1.4V$$

Therefore, the required voltage of logic level shifting from ECL to CMOS is:

$$V_{Shift} = V_{M(ECL)} - V_{M(CMOS)} = 3.8 - 1.4 = 2.4 \text{ V}.$$

As the voltage drop across a forward biased diode is about:

$$V_{D(on)} \sim 0.8V,$$

the number of required diodes is given by:

$$n = (V_{shift})/(V_{D(on)}) = 2.4/0.8 = 3,$$

Therefore, with the embodiment of the above voltage shifting circuit comprising a proper number of forward biased diodes and a resistor branched to GND, a traditional ECL circuit can be adapted to directly drive a CMOS receiver.

Figure 7B:
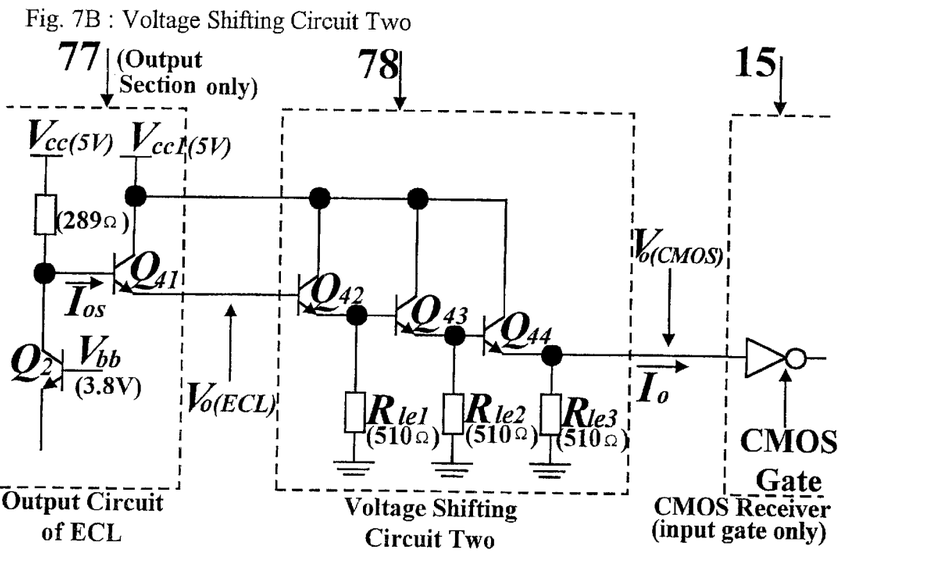
FIG. 7B details an alternative embodiment of the present invention where an alternative voltage shifting circuit is added to the output section of the ECL circuit from the prior art so that it can directly drive a CMOS receiver.

FIG. 7B details an alternative embodiment of the present invention where an alternative voltage shifting circuit 78 is added to the output section of the traditional ECL circuit 77 from the prior art so that it can directly drive a CMOS receiver 15. The voltage shifting circuit 78, enclosed in a dashed block, comprises a number of, in this case three (3), cascaded transistors $Q_{42}$, $Q_{43}$ and $Q_{44}$ biased to their On-state in a Darlington configuration with their respective emitter resistors $R_{le1}$, $R_{le2}$ and $Re_{le3}$ branched to GND. As the base-to-emitter voltage drop of a transistor biased in its On-state is essentially the same as that of a forward biased diode, the voltage shifting circuit with cascaded transistors, in terms of voltage calculations, works the same way as the aforementioned voltage shifting circuit with forward biased diodes. However, in the case of cascaded transistors the resulting node $V_{(CMOS)}$ has more current-driving capability than the case of forward biased diodes. For those skilled in the art, this is due to the cascaded common emitter current gain in a Darlington configuration of transistors. Specifically, the follow equation represents the current gain:

$$I_O/I_{OS} = (\beta_F + 1)^4,$$

where $\beta_F$ is the forward current gain of transistors $Q_{41}$, $Q_{42}$, $Q_{43}$ and $Q_{44}$. As an example, assume a typical value of $\beta_F$=100 and a load current $I_O$ of 5 mA through the node $V_{O(CMOS)}$ from the CMOS receiver 15. The corresponding load current $I_{OS}$ incurred on the typical ECL circuit 77 is given by the following:

$$I_{OS} = I_O/(\beta_F+1)^4 = 5*10^{-3}/(100+1)^4 = 4.8*10^{-11} = 0.048 \text{ nA},$$

a negligible amount. Therefore, with the embodiment of the above alternative voltage shifting circuit comprising a proper number of cascaded transistors connected in a Darlington configuration and with their respective emitter resistors branched to GND, a traditional ECL circuit can be adapted to directly drive a CMOS receiver while providing a high current driving capability.

Out of the two voltage shifting circuits presented in FIG. 7A and FIG. 7B, the embodiment of FIG. 7A using diodes is the most preferred solution as it offers lower cost, more compact size and less power consumption while still being able to drive a CMOS gate that is typically a light load.

The present invention has been described using exemplary preferred embodiments to adapt the ECL technology to conform to the USB specification thereby functions as effective USB transceivers for high speed serial data communication between computers and electronic devices. However, for those skilled in this field, the preferred embodiments can be easily adapted and modified to suit additional applications without departing from the spirit and scope of this invention. Thus, it is to be understood that the scope of the invention is not limited to the disclosed embodiments. On the contrary, it is intended to cover various modifications and similar arrangements based upon the same operating principle. The scope of the claims, therefore, should be accorded the broadest interpretations so as to encompass all such modifications and similar arrangements.

What is claimed is:

1. An improved Emitter Coupled Logic (ECL) circuit based upon an ECL circuit of a conventional design wherein, while preserving the inherent advantages of a traditional ECL such as, but not limited to, high frequency operation, low propagation delay, ability to drive high cable load, low internal switching noise and high noise immunity to external noises, the improvement of the ECL circuit comprising one or more of the following embodiments with their respective additional advantages:

addition of a capacitor coupling circuit, further comprising a network of a serial pass capacitor C and two bias resistors Rb1 and Rb2 powered with a supply voltage, connected to an input section of the ECL circuit of a conventional design such that a required quiescent current at the input section of the said conventional ECL circuit is provided by the powered bias resistors Rb1 and Rb2 and the RC-time constant of the said capacitor coupling circuit is made significantly longer than the clock period corresponding to a predetermined minimum frequency of operation whereby the input terminals of the improved ECL circuit are made directly drivable by a CMOS transmitter while the said improved ECL circuit being capable of a range of high frequency operation up to 240 MHz with said pre-determined minimum frequency of operation corresponding to a maximum allowable pulse width of 500 µS;

proper modification of the value of an emitter resistor that is part of an emitter resistance network of the said ECL circuit of a conventional design whereby a desired peak-to-peak amplitude of output voltage of 400 mV, different from an approximate value of 800 mV from the conventional design, is obtained;

addition of a voltage shifting circuit, further comprising a selected number of serially connected, forward biased diodes and a resistor Rc branched to GND, connected to an output section of the ECL circuit of a conventional design such that the difference in threshold voltage between the conventional ECL circuit and an external CMOS receiver is essentially compensated for by the summation of the voltage drops across the said serially connected, forward biased diodes whereby the output terminals of the improved ECL circuit are made capable of directly driving an external CMOS receiver;

addition of an alternative voltage shifting circuit, further comprising a selected number of cascaded transistors individually biased to their On-state and with their respective emitter resistors branched to GND, connected to an output section of the ECL circuit of a conventional design such that the difference in threshold voltage between the conventional ECL circuit and an external CMOS receiver is essentially compensated by the summation of the voltage drops across the base-emitter junction of the said cascaded transistors whereby the output terminals of the improved ECL circuit are made capable of directly driving, with a high current driving capability, an external CMOS receiver; and addition of a collector electrode switch network, further comprising a selected number of switching transistors, having their respective bases further tied to a number of external control signals, connected in series with the power supply terminals of the said ECL circuit of a conventional design whereby the output terminals of the improved ECL circuit, in addition to being switchable between their two normal logic states, are made controllably switchable into a third state of high impedance for bi-directional differential data transmission under a half duplexing mode whereby the said improved ECL circuit can be used to completely implement the bi-directional data transmission, with a specific interface of USB 2.0, between a computer and an electronic device.

2. An improved Emitter Coupled Logic (ECL) circuit based upon an ECL circuit of a conventional design wherein, while preserving the inherent advantages of a traditional ECL such as, but not limited to, high frequency operation, low propagation delay, ability to drive high cable load, low internal switching noise and high noise immunity to external noises, the improvement of the ECL circuit comprises:

addition of a collector electrode switch network, further comprising a selected number of switching transistors, having their respective bases further tied to a number of external control signals, connected in series with the power supply terminals of the said ECL circuit of a conventional design whereby the output terminals of the improved ECL circuit, in addition to being switchable between their two normal logic states, are made controllably switchable into a third state of high impedance.

3. The improved ECL circuit of claim 2 wherein the improvement further comprises:

addition of a capacitor coupling circuit, further comprising a network of a serial pass capacitor C and two bias resistors Rb1 and Rb2 powered with a supply voltage, connected to an input section of the ECL circuit of a conventional design such that a required quiescent current at the input section of the said conventional ECL circuit is provided by the powered bias resistors Rb1 and Rb2 and the RC-time constant of the said capacitor coupling circuit is made significantly longer than the clock period corresponding to a pre-determined minimum frequency of operation whereby the input terminals of the improved ECL circuit are made directly drivable by a CMOS (Complementary Metal Oxide Semiconductor) transmitter while the said improved ECL circuit being capable of a range of high frequency operation with the said pre-determined minimum frequency of operation.

4. The improved ECL circuit of claim 3 wherein the improvement further comprises:

proper modification of the value of an emitter resistor that is part of an emitter resistance network of the said ECL circuit of a conventional design whereby a desired peak-to-peak amplitude of output voltage, generally different from a value from the conventional design, is obtained.

5. The improved ECL circuit of claim 4 wherein the improvement further comprises:

addition of a voltage shifting circuit, further comprising a selected number of serially connected, forward biased diodes and a resistor Rc branched to GND, connected to an output section of the ECL circuit of a conventional design such that the difference in threshold voltage between the conventional ECL circuit and an external CMOS receiver is essentially compensated for by the summation of the voltage drops across the said serially connected, forward biased diodes whereby the output terminals of the improved ECL circuit are made capable of directly driving an external CMOS receiver.

6. The improved ECL circuit of claim 4 wherein the improvement further comprises:

addition of an alternative voltage shifting circuit, further comprising a selected number of cascaded transistors individually biased to their On-state and with their respective emitter resistors branched to GND, connected to an output section of the ECL circuit of a conventional design such that the difference in threshold voltage between the conventional ECL circuit and an external CMOS receiver is essentially compensated by the summation of the voltage drops across the base-emitter junction of the said cascaded transistors whereby the output terminals of the improved ECL circuit are made capable of directly driving, with a high current driving capability, an external CMOS receiver.

\* \* \* \* \*